(12) United States Patent
Lee et al.

(10) Patent No.: US 8,554,986 B2
(45) Date of Patent: Oct. 8, 2013

(54) DEVICE AND METHOD OF CONTROLLING FLASH MEMORY

(75) Inventors: Jongmin Lee, Seongnam-si (KR); Donghee Lee, Seongnam-si (KR); Hanmook Park, Seongnam-si (KR)

(73) Assignee: OCZ Technology Group Inc., San Jose, CA (US)

( * ) Notice: Subject to any disclaimer, the term of this patent is extended or adjusted under 35 U.S.C. 154(b) by 154 days.

(21) Appl. No.: 13/058,314

(22) PCT Filed: Sep. 4, 2008

(86) PCT No.: PCT/KR2008/005198
§ 371 (c)(1),
(2), (4) Date: Feb. 9, 2011

(87) PCT Pub. No.: WO2010/018886
PCT Pub. Date: Feb. 18, 2010

(65) Prior Publication Data
US 2011/0145490 A1    Jun. 16, 2011

(51) Int. Cl.
*G06F 12/00*    (2006.01)
(52) U.S. Cl.
USPC .............. 711/103; 711/E12.07; 711/E12.078
(58) Field of Classification Search
USPC ........................................................ 711/103
See application file for complete search history.

(56) References Cited

U.S. PATENT DOCUMENTS

| 7,903,486 B2 * | 3/2011 | Danilak | 365/201 |
| 2006/0179263 A1 | 8/2006 | Song et al. | 711/170 |
| 2007/0033325 A1 | 2/2007 | Sinclair | |
| 2007/0043900 A1 | 2/2007 | Yun | 711/103 |
| 2008/0034154 A1 * | 2/2008 | Lee et al. | 711/103 |
| 2008/0074931 A1 * | 3/2008 | Kim et al. | 365/185.29 |

OTHER PUBLICATIONS

Supplementary European Search Report dated Mar. 23, 2012 in European Application No. 08793678.7, filed Sep. 4, 2008.
"Block Recycling Schemes and Their Cost-based Optimization in NAND Flash Memory Based Storage System" In: Proceedings of the 7th ACM & IEEE International Conference on Embedded Software, 2007, pp. 174-182.
"Cost-based Optimization of Block Recycling Scheme in NAND Flash Memory Based Storage System" (In Korean). Journal of KIISE: Computing Practices and Letters. Dec. 2007, vol. 13, No. 7, pp. 508-519.
PCT International Search Report, 3 pgs, May 12, 2009.

* cited by examiner

*Primary Examiner* — Refinald Bragdon
*Assistant Examiner* — Hamdy S Ahmed
(74) *Attorney, Agent, or Firm* — Hartman Global IP Law; Gary M. Hartman; Domenica N. S. Hartman

(57) ABSTRACT

Disclosed is a flash memory controlling method and controlling device. The flash memory controlling method including calculating a cost for each of available block recycling schemes based on a multi-block erase function when the multi-block erase function is supported, the multi-block erase function being a function that simultaneously erases data stored in a plurality of blocks of a flash memory and selecting at least one scheme from among the available block recycling schemes based on the calculated cost, and managing at least one block using the at least one method selected from among the available block recycling schemes.

26 Claims, 8 Drawing Sheets

DEVICE AND METHOD OF CONTROLLING FLASH MEMORY

TECHNICAL FIELD

The present invention relates to a method for arranging data recorded in blocks existing in a flash memory and recycling the blocks.

BACKGROUND ART

A flash memory, a non-volatile memory semiconductor which can electrically erase or program data, has an advantage of both a RAM that can freely record and erase data and a ROM that can maintain recorded data without power supply. The flash memory is used in many applications, such as a digital camera, PDA, MP3 player, portable phone, portable storing device, and the like.

The flash memory is composed of a plurality of blocks, and each of the plurality of blocks includes a plurality of pages.

In the flash memory, data is programmed in page units. That is, when a program function is performed, data may be sequentially recorded in the pages existing in the flash memory. Also, the data is erased in block units due to an increased complexity of a design, a general problem occurring when the flash memory is actually implemented, and the like. For example, when a single block includes two or more pages, a general flash memory may perform an erase function with respect to the entire single block (the two or more pages), but the general flash memory may not sequentially perform the erase function with respect to one page of the two or more pages.

Also, the flash memory has a limitation that in-place update is impossible. That is, when data recorded in a page A is required to be updated, updated data may not be programmed to the page A again and may be required to be programmed to a page B.

In this instance, when a number of updates of the data increase, pages used in the past become invalid pages. Accordingly, to effectively use the flash memory, it is required to properly collect the invalid pages and initialize them to make initialized blocks. A scheme used in properly collecting and initializing the invalid pages is referred to as a 'block recycling scheme'.

DISCLOSURE OF INVENTION

Technical Goals

An aspect of the present invention provides a flash memory controlling device and controlling method that support a multi-block erase function that simultaneously erases data stored in a plurality of blocks of a flash memory, and thereby can reduce cost expended for the block recycle.

Another aspect of the present invention also provides a flash memory controlling device and controlling method that calculate a cost for each of available block recycling schemes based on a multi-block erase function, and select at least one block recycling scheme based on the calculated result, and thereby can use a scheme optimized for a block recycle.

Another aspect of the present invention also provides a flash memory controlling device and controlling method that selectively erase elimination target data recorded in an invalid page based on page units, not block units, and thereby can provide a new and more effective block recycling scheme.

Technical Solutions

According to an aspect of the present invention, there is provided a method for controlling a flash memory including a first block and a second block, the method including selectively erasing elimination target data recorded in at least one invalid page existing in the first block, copying valid data recorded in at least one valid page existing in the second block to the at least one invalid page existing in the first block where the elimination target data is erased, and erasing data recorded in a plurality of pages existing in the second block.

According to another aspect of the present invention, there is provided a method for controlling a flash memory device including calculating a cost for each of available block recycling schemes based on a multi-block erase function when the multi-block erase function is supported, the multi-block erase function being a function that simultaneously erases data stored in a plurality of blocks of a flash memory, selecting at least one scheme from among the available block recycling schemes based on the calculated cost, and managing at least one block using the at least one method selected from among the available block recycling schemes.

According to still another aspect of the present invention, there is provided a device for controlling a flash memory including an erasing unit to support a multi-block erase function that simultaneously erases data stored in a plurality of blocks of the flash memory, and a managing unit to manage at least one block using at least one from among available block recycling schemes when the multi-block erase function is supported.

Advantageous Effects

According to an aspect of the present invention, a flash memory controlling device and controlling method support a multi-block erase function that simultaneously erases data stored in a plurality of blocks of a flash memory, and thereby can reduce cost expended for the block recycle.

According to another aspect of the present invention, a flash memory controlling device and controlling method calculate a cost for each of available block recycling schemes based on a multi-block erase function and select at least one block recycling scheme based on the calculated result, and thereby can use a scheme optimized for a block recycle.

According to another aspect of the present invention, a flash memory controlling device and controlling method selectively erase elimination target data recorded in an invalid page based on page units, not block units, and thereby can provide a new and more effective block recycling scheme.

BEST MODE FOR CARRYING OUT THE INVENTION

Hereinafter, exemplary embodiments according to the present invention will be described in detail referring to attached drawings.

Block Recycling Schemes

It is required to properly collect and initialize invalid pages to more effectively use a flash memory. In this instance, a scheme used in the proper collecting and initializing of the invalid pages are referred to as a 'block recycling scheme'.

The block recycling scheme may be various, and more particularly, include an merge operation scheme, switch operation scheme, copy and switch operation scheme, and migration operation scheme. Hereinafter, the merge operation scheme, switch operation scheme, copy and switch operation scheme, and migration operation scheme will be described in detail.

(1) Merge Operation Scheme

Figure 1:
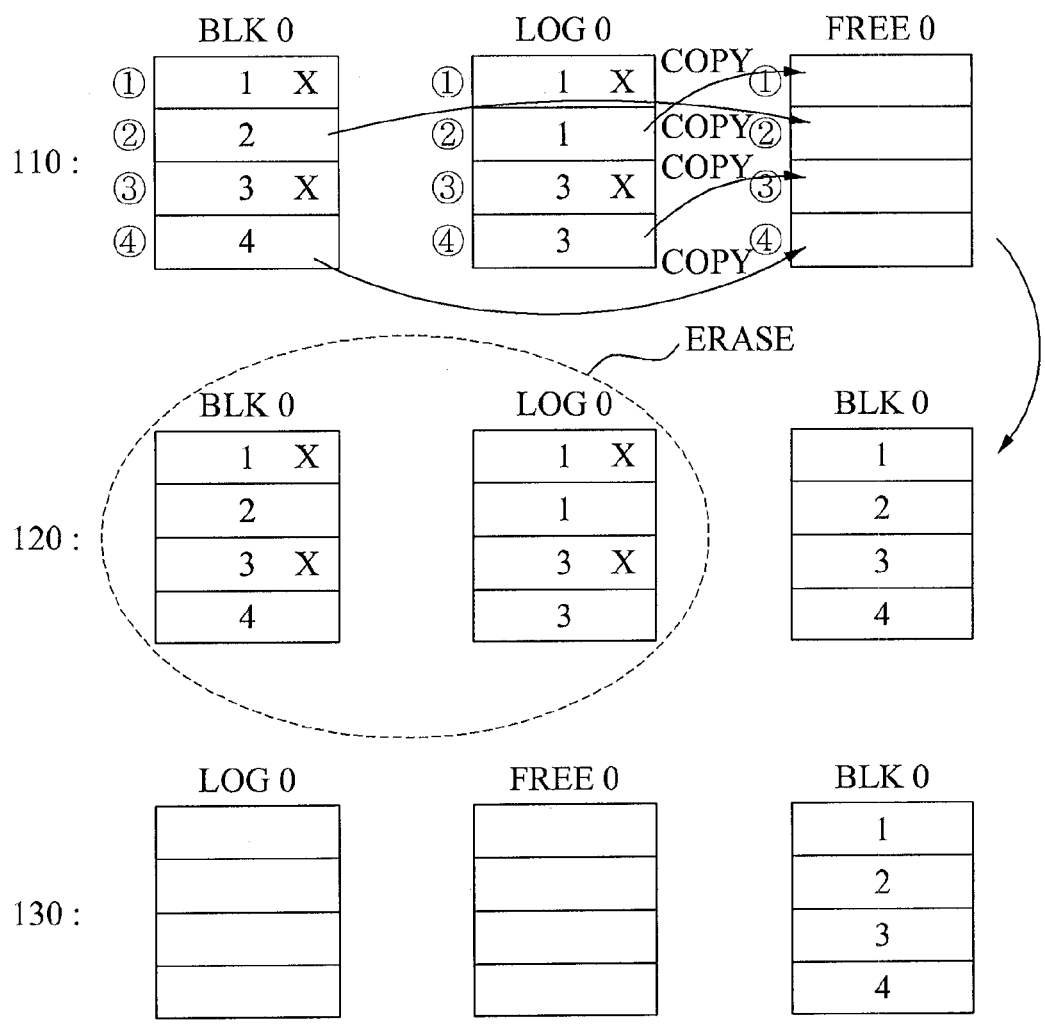
FIG. 1 conceptually illustrates an merge operation procedure with respect to blocks according to an example embodiment of the present invention.

FIG. 1 conceptually illustrates an merge operation procedure with respect to blocks according to an example embodiment of the present invention.

Referring to FIG. 1, a flash memory includes a data block (BLK0), log block (Log0), and empty block (Free0). Here, the BLK0 and Log0, and Free0 are respectively composed of four pages.

Initial original data is recorded in the four pages existing in the BLK0. When the data is required to be updated, updated data is recorded in pages existing in the Log0. Also, data recorded in the pages existing in the Log0 is continuously updated in the Log0.

Referring to a reference numeral 110, since data recorded in a first page and third page is updated in the BLK0 and recorded in the Log0, the data is meaningless data required to be discarded. Here, the first page and the third page in the BLK0 are referred to as invalid pages. However, since data stored in a second page and fourth page is meaningful data, a second page and fourth page are valid pages.

Also, in the reference numeral 110, the data stored in a first page of the Log0 is updated and recorded in a second page, and data stored in a third page is updated and recorded in a fourth page. Therefore, the first page and third page of Log0 are invalid pages, and the second page and fourth page of the Log0 are valid pages.

According to an merging operation scheme, data recorded in the valid page of the BLK0 and Log 0 is copied to pages of the Free0. In particularly, data recorded in the second page and fourth page of Log0 is copied to a first page and third page of the Free0. Therefore, only the data recorded in the valid page is stored in the Free0.

Referring to a reference numeral 120, the Free0 of the reference numeral 110 becomes a new BLK0. That is, data recorded in the valid pages is collected and arranged in the new BLK0. In this instance, existing BLK0 and Log 0 are generally erased in block units. However, according to an example embodiment, an erasing operation is performed in page units and it will be described in detail below.

A reference numeral 130 represents that the existing BLK0 and Log0 are initialized through erasing the existing BLK0 and Log0. Also, the BLK0 becomes Log0. Also, the new BLK0 only store meaningful data. Therefore, according to the merge operation procedure, blocks are recycled through procedures illustrated in the reference numerals 110, 120, and 130.

In this instance, it is assumed that a required cost per page for copying data is $C_{cp}$, and a number of copied pages is the same as a number of pages, $N_p$, included in a single block. Also, it is assumed that a cost for erasing a block is $C_E$, and a number of empty pages is obtained through the merge operation scheme is $N_p$. Accordingly, when the merge operation scheme is applied, a cost expended for obtaining a single empty page is expressed as given in Equation 1.

$$= \frac{2 \cdot C_E + N_p \cdot C_{cp}}{N_p} \qquad \text{[Equation 1]}$$

A cost expended for obtaining a single empty page when the merge operation scheme is applied However, when a multi-block erase function, the multi-block erase function being a function that can simultaneously perform erasing with respect to a plurality of blocks, is supported, Equation 1 is required to be changed. This will be explained again below.

(2) Switch Operation Scheme

When every page existing in a data block required to be recycled is an invalid page and every page existing in a log block corresponding to the data block is a valid page, the switch operation scheme may not be applied.

Figure 2:
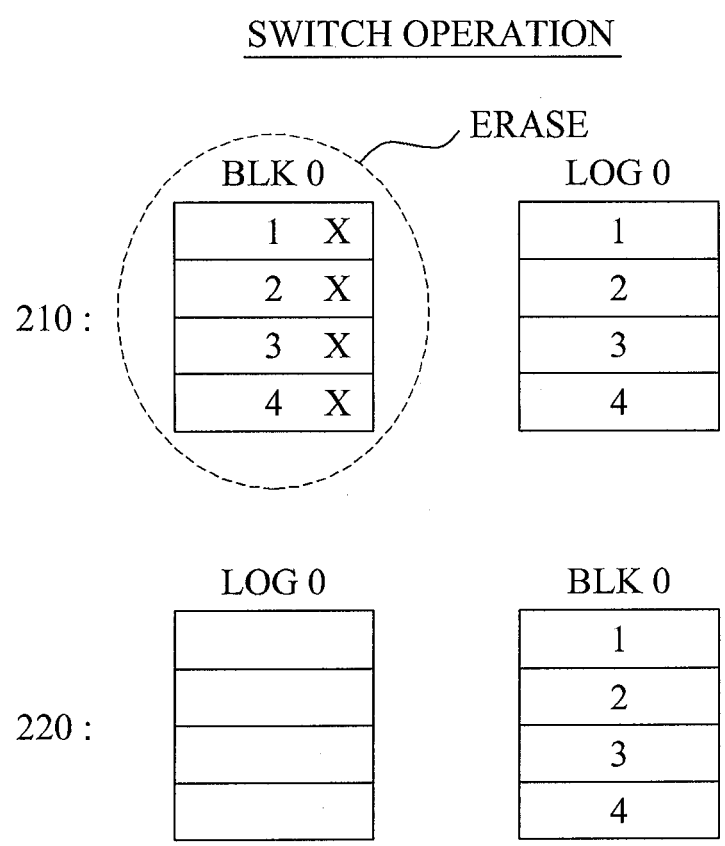
FIG. 2 conceptually illustrates an switch operation procedure with respect to blocks according to an example embodiment of the present invention.

FIG. 2 conceptually illustrates an switch operation procedure with respect to blocks according to an example embodiment of the present invention.

Referring to a reference numeral 210, four pages existing in a BLK0 are invalid pages and four pages existing in a Log0 are valid pages. In this instance, erasing is performed with respect to the BLK0.

Referring to a reference numeral 220, the BLK0 of reference numeral 210 is erased. Also, the BLK0 of the reference numeral 210 becomes a new Log0 and the Log0 of the reference numeral 210 becomes a new BLK0.

Four empty pages are obtained through the switch operation scheme. In general, when the switch operation scheme is applied, a cost expended for obtaining a single empty page is expressed as given in Equation 2.

$$= \frac{C_E}{N_p} \qquad \text{[Equation 2]}$$

A cost expended for obtaining a single empty page when the switch operation scheme is applied is expressed as given in Equation 2

(3) Copy and Switch Operation Scheme

The copy and switch operation scheme is well-suited for when every page of a log block corresponding to a data block required to be recycled is a valid page.

Figure 3:
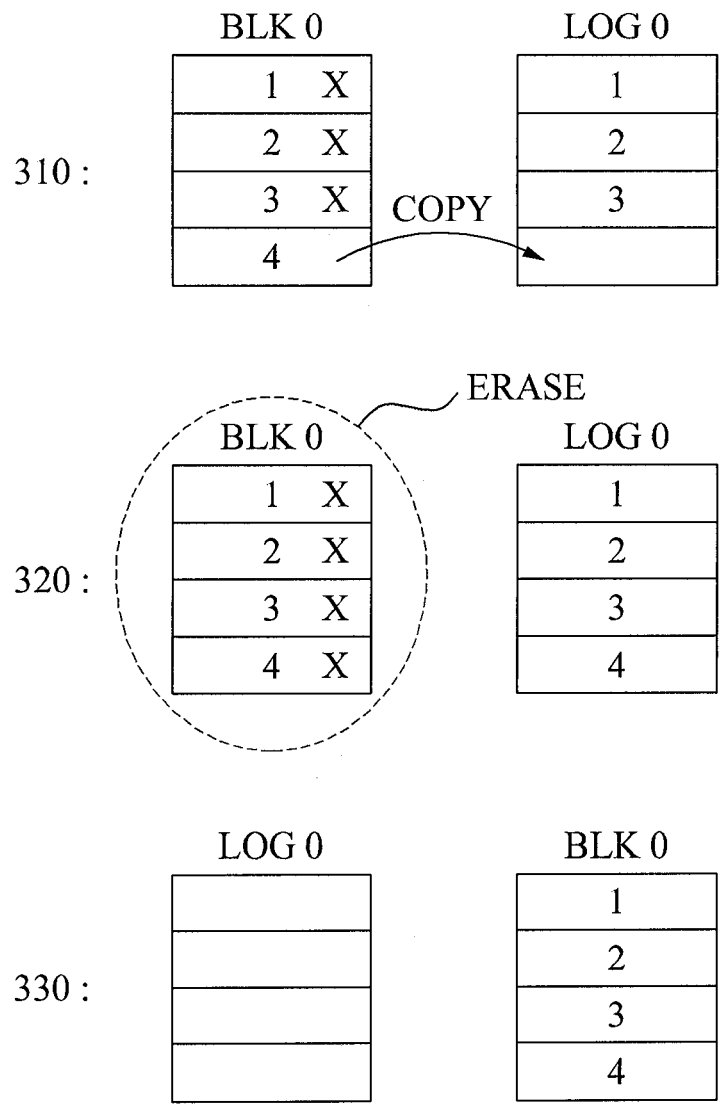
FIG. 3 conceptually illustrates a copy and switch operation procedure with respect to blocks according to an example embodiment of the present invention.

FIG. 3 conceptually illustrates a copy and switch operation procedure with respect to blocks according to an example embodiment of the present invention.

Referring to a reference numeral 310, a BLK0 includes three invalid pages and a single valid page. Also, the data recorded in the three invalid pages of the BLK0 are updated and recorded in three pages existing in the Log0. According to the copy and switch operation scheme, data recorded in a fourth page of the BLK0, which is a valid page, is copied to a fourth page of the Log0, which is an empty page.

Also, referring to reference numeral 320, since the data recorded in the fourth page of the BLK0 is copied to the fourth page of the Log0, the fourth page of the BLK0 is invalid page. In this instance, the BLK0 is erased.

Also, referring to reference numeral 330, the BLK0 of the reference numerals 310 and 320 is erased and the Log0 of the reference numerals 310 and 320 is composed of valid pages. In this instance, the Log0 of the reference numerals 310 and 320 becomes a new BLK0 and the BLK0 of the reference numerals 310 and 320 becomes a new Log0 through exchanging the BLK0 and Log0.

According to the copy and switch operation scheme, to obtain $N_p$ new empty pages, a $kC_{cp}$ cost (k: a number of the copied pages) is expended during copying and $C_E$ is expended during erasing. Therefore, a cost expended for obtaining a single empty page through the copy and switch operation scheme is expressed as given in Equation 3.

$$= \frac{C_E + k \cdot C_{cp}}{N_p} \quad \text{[Equation 3]}$$

A cost expended for obtaining a single empty page when the copy and switch operation scheme is applied (4) Migration Operation Scheme According to the migration operation scheme, k valid pages of a log block corresponding to a data block required to be recycled is copied to pages of an empty block. Subsequently, the log block is erased. Accordingly, the erased log block becomes a new empty block.

Figure 4:
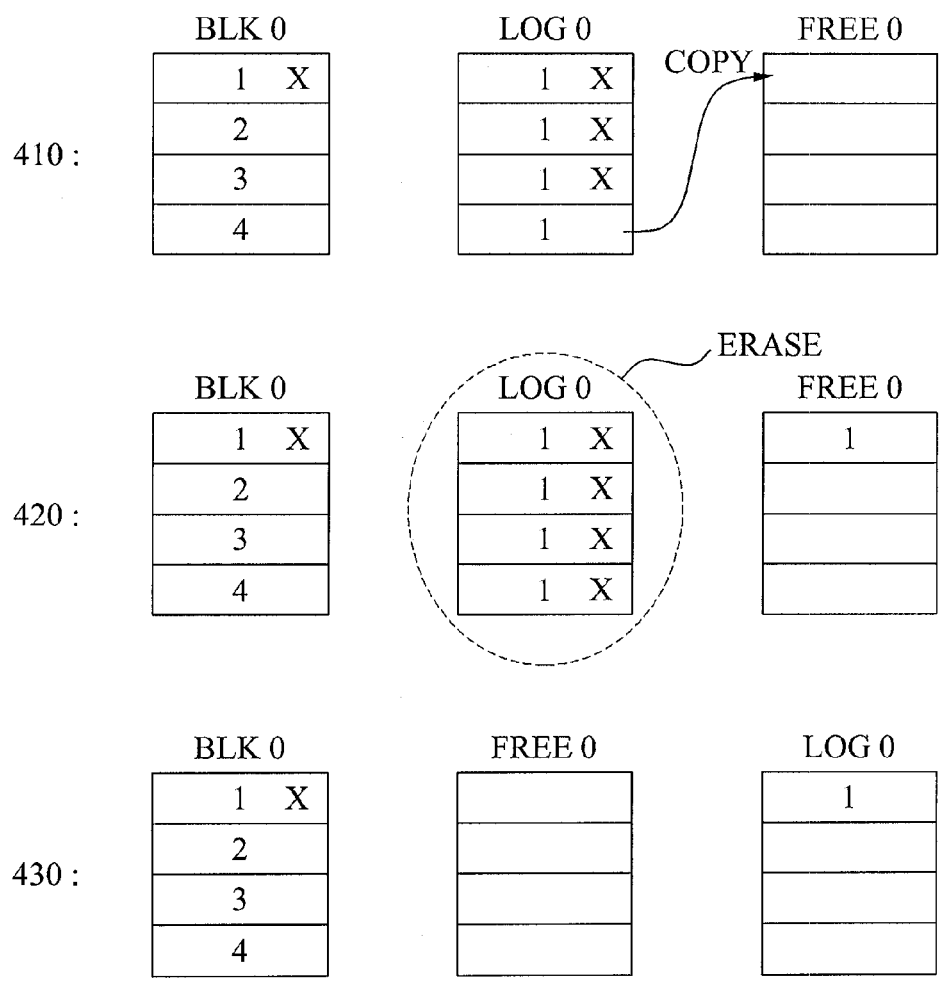
FIG. 4 conceptually illustrates a migration operation procedure with respect to blocks according to an example embodiment of the present invention.

FIG. 4 conceptually illustrates a migration operation procedure with respect to blocks according to an example embodiment of the present invention.

Referring to a reference numeral 410, three pages from among four pages existing in a Log0 are invalid pages, and only one page is a valid page. In this instance, data recorded in a fourth page of the Log0 is copied to a page existing in a Free0.

Also, referring to a reference numeral 420, since the data recorded in the fourth page of the Log0 is copied to a page existing in the Free0, the fourth page of the Log0 is processed as an invalid page. In this instance, the Log0 is erased.

Also, referring to a reference numeral 430, the Log0 of the reference numeral 420 is erased, and a new Free0 is made.

Therefore, according to the migration operation scheme, $N_p$-k new empty pages are made, the $N_p$ being a number of pages included in a single block and k being a number of copied pages. That is, to make $N_p$-k new empty pages, $C_E$ is required during erasing and $kC_{cp}$ is required during copying. Accordingly, a cost expended for obtaining a single empty page through the migration operation scheme is expressed as given in Equation 4.

$$= \frac{C_E + k \cdot C_{cp}}{N_p - k} \quad \text{[Equation 4]}$$

A cost expended for obtaining a single empty page when the migration operation scheme is applied The above description with respect to the merge operation, switch operation, switch and copy operation, and migration operation scheme concerns a case when erasing is performed in block units. However, when the erasing can be simultaneously performed with respect to a plurality blocks or performed in page units, another scheme may be suggested unlike the block cycling scheme.

Page Erase and Copy Operation Scheme

Figure 5:
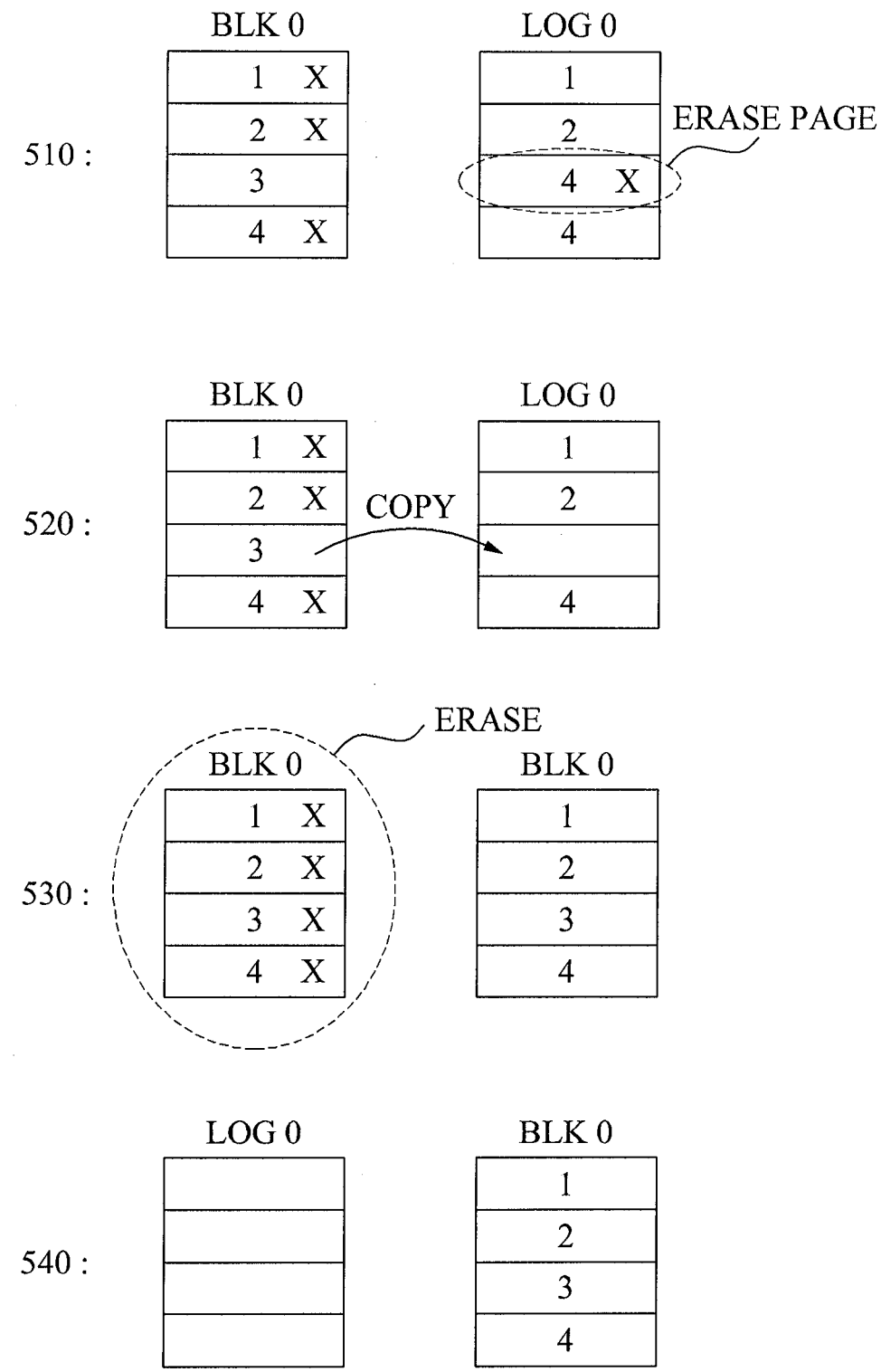
FIG. 5 conceptually illustrates a page erase and copy operation procedure that supports a page unit erase function according to an example embodiment of the present invention.

FIG. 5 conceptually illustrates a page erase and copy operation procedure that supports a page unit erase function according to an example embodiment.

Referring to reference numeral 510, since erasing may be performed in page units, only a third page existing in a Log0, which is an invalid page, is erased. That is, a first, second, and fourth page in the Log0, which are valid pages, remain and only the third page is selectively erased.

Also, referring to reference numeral 520, a valid page existing in the BLK0 is copied to an empty page of the Log0. Subsequently, valid page existing in the BLK0 is regarded as an invalid page.

Also, referring to reference numeral 530, the BLK0 is erased.

Also, referring to reference numeral 540, the Log0 of the reference numeral 530 only includes valid pages. That is, Log0 of the reference numeral 530 is regarded as a new BLK0.

Also, since the BLK0 of the reference numeral 530 is erased, the BLK0 becomes an empty block and then it is regarded as a new Log0 corresponding to a new BLK0.

However, although the erasing is performed in page units, there may be a case that a minimum number of pages required to be erased is greater than one while the erasing is performed one time. For example, the erasing may be performed with respect to two or three pages at a minimum. In this instance, erasing only the invalid pages existing in the Log0 of the reference numeral 510 is impossible. To erase the invalid pages existing in the Log0 of the reference numeral 510, the valid page inevitably may be required to be erased.

In this instance, according to an example embodiment, prior to performing of the erasing, the valid page that is inevitably required to be erased may be copied to another empty page when performing the erasing. Subsequently, previously copied data in the other page is recopied to the new Log0, thereby preserving data in the valid page to be inevitably erased.

Therefore, according to the page erase and copy operation scheme, $C_{PE}$ is required to erase invalid pages, and $kC_{cp}$ is required to copy k valid pages. Also, $C_E$ is expended to erase any one block. Also, since a new single empty block is obtained through the page erase and copy operation scheme, a number of pages obtained is $N_p$.

Accordingly, a cost expended for obtaining a new single empty page through the page erase and copy operation scheme is expressed as given in Equation 5.

$$= \frac{C_E + C_{PE} + k \cdot C_{cp} + \alpha}{N_p} \quad \text{[Equation 5]}$$

$\alpha$ = Additional copy operations

A cost expended for obtaining a single empty page when the page erase and copy operation scheme is applied Here, $\alpha$ is a cost corresponding to a copy procedure that is additionally required when valid pages are inevitably erased to erase invalid pages.

Cost Model of a Block Recycling Scheme when a Multi-Block Erase Function is Supported Above described example embodiments have described an operational principle and cost of a block recycling scheme when erasing is performed with respect to a single block. However, according to an example embodiment of the present invention, data (information) stored in a plurality of blocks may be simultaneously erased. In this instance, a cost expended for obtaining a single page with respect to each block recycling scheme is required to be corrected.

Hereinafter, it is assumed that erasing is performed with respect to M blocks.

(1) Correcting a Cost Model of Merge Operation Scheme

In the description as to FIG. 1 and Equation 1, it is assumed that $C_E$ is a cost for erasing a single block. However, when M blocks are simultaneously erased, a cost expended for erasing a single block decreases to $C_E/M$. Therefore, Equation 1 is required to be corrected as given in Equation 6.

$$= \frac{\frac{2 \cdot C_E}{M} + N_p \cdot C_{cp}}{N_p} \quad \text{[Equation 6]}$$

A cost expended for obtaining a single empty page when the multi-block erase function is supported and the merge operation scheme is applied (2) Correcting a Cost Model of Switch Operation Scheme When a multi-block erase function is supported, Equation 2 is required to be corrected as given in Equation 7.

$$= \frac{\frac{C_E}{M}}{N_p} \quad \text{[Equation 7]}$$

A cost expended for obtaining a single empty page when the multi-block erase function is supported and the switch operation scheme is applied (3) Correcting a Cost Model of Copy and Switch Operation Scheme When a multi-block erase function is supported, Equation 3 is required to be corrected as given in Equation 8.

$$= \frac{\frac{C_E}{M} + k \cdot C_{cp}}{N_p} \quad \text{[Equation 8]}$$

A cost expended for obtaining a single empty page when the multi-block erase function is supported and the copy and switch operation scheme is applied (4) Correcting a Cost Model of Migration Operation Scheme When the multi-block erase function is supported, Equation 4 is required to be corrected as given in Equation 9.

$$= \frac{\frac{C_E}{M} + k \cdot C_{cp}}{N_p - k} \quad \text{[Equation 9]}$$

A cost expended for obtaining a single empty page when the multi-block erase function is supported and the migration operation scheme is applied (5) Correcting a Cost Model of Page Erase and Copy Operation Scheme When the multi-block erase function is supported, Equation 5 is required to be corrected as given in Equation 10.

$$= \frac{\frac{C_E}{M} + C_{PE} + k \cdot C_{cp} + \alpha}{N_p} \quad \text{[Equation 10]}$$

$\alpha$ = Additional copy operations

Figure 6:
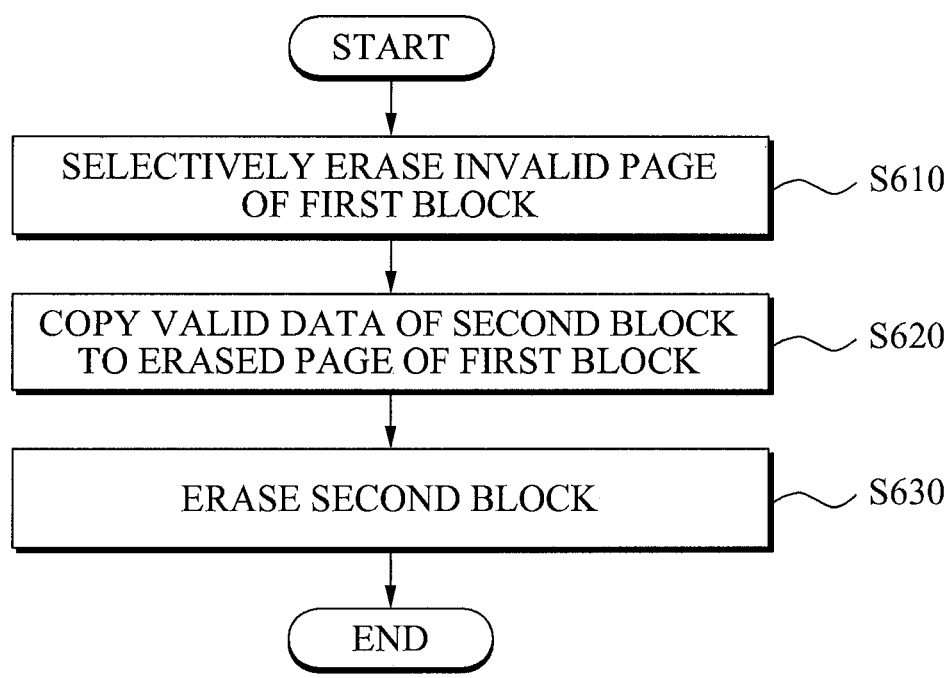
FIG. 6 is a flowchart illustrating a page erase and copy operation scheme used in a flash memory controlling method according to an example embodiment of the present invention.

A cost expended for obtaining a single empty page when the multi-block erase function is supported and the page erase and copy operation scheme is applied FIG. 6 is a flowchart illustrating a page erase and copy operation scheme used in a flash memory controlling method according to an example embodiment of the present invention.

Referring to FIG. 6, a page erase and copy operation scheme according to an example embodiment of the present invention selectively erase elimination target data recorded in at least one invalid page existing in a first block in operation S610. Here, the first block may be any one of a data block or a log block.

That is, the page erase and copy scheme may be applied to when a page erase function is supported, and a number of pages to be erased may be greater than one. However, when the elimination target data recorded in the at least one invalid page existing in the first block is selectively erased, data recorded in at least one valid page existing in the first block may be erased.

In this instance, the page erase and copy operation scheme according to an example embodiment of the present invention may further include copying data recorded in the at least one valid page existing in the first block to at least one page existing in a third block (not illustrated in FIG. 6).

Also, the page erase and copy operation scheme according to an example embodiment of the present invention copies valid data recorded in at least one valid page existing in a second block to the at least one invalid page existing in the first block where the elimination target data is erased in operation S620.

When the copied data from the valid page of the first block to the at least one page existing in the third block exists, the data may be copied to the pages existing in the first block.

Also, the page erase and copy operation scheme according to an example embodiment of the present invention erases data recorded in a plurality of pages existing in the second block in operation S630. In this instance, in general, erasing is performed in block units and may be simultaneously performed with respect to the plurality of pages existing in the second block.

Accordingly, the second block is initialized and data may be programmed to the second block again.

Figure 7:
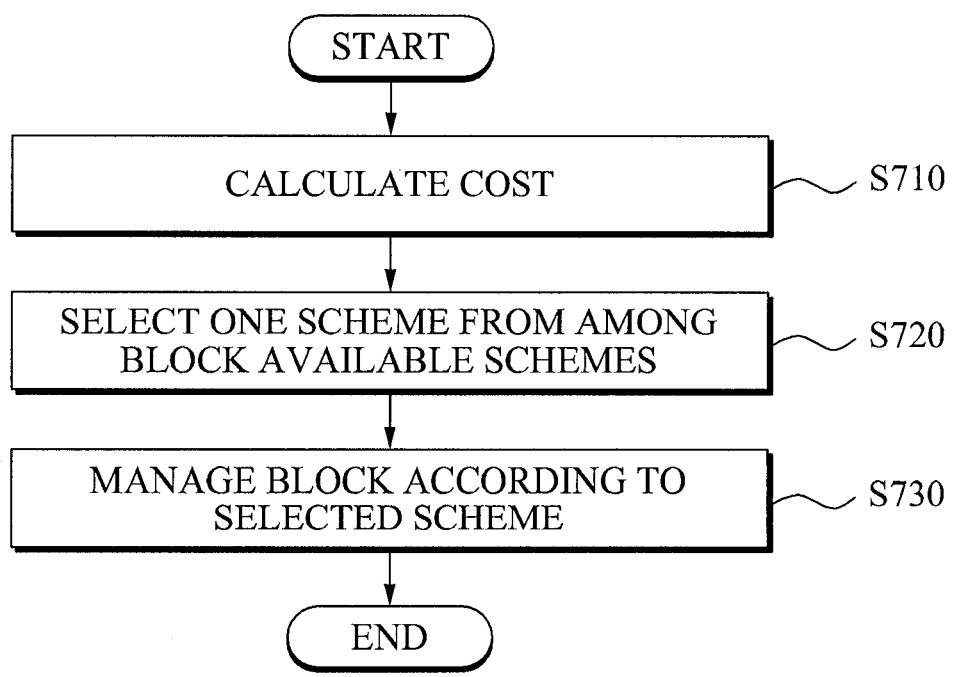
FIG. 7 is an operational flowchart illustrating a flash memory controlling method according to another example embodiment of the present invention.

FIG. 7 is an operational flowchart illustrating a flash memory controlling method according to another example embodiment of the present invention.

Referring to FIG. 7, the flash memory controlling method according to another example embodiment of the present invention calculates each of the available block recycling schemes based on a multi-block erase function when the multi-block erase function is supported in operation S710, the multi-block erase function being a function that simultaneously erases data stored in a plurality of blocks of a flash memory. Here, the available block recycle scheme may include an merge operation scheme, an switch operation scheme, a copy and switch operation scheme, a migration operation scheme, and a page erase and copy operation scheme.

Particularly, the calculating of each available block recycling scheme in operation S710 may be an operation that calculates the cost for each of the available block recycling schemes based on a number of the plurality of blocks where the multi-block erase function is applied.

Also, the flash memory controlling method according to another example embodiment of the present invention selects at least one scheme from among the available block recycling schemes based on the calculated cost in operation S720. In this instance, at least one scheme with a minimum cost may be selected from among the available block recycling schemes.

Also, the flash memory controlling method according to another example embodiment of the present invention manages at least one block using the at least one method selected from among the available block recycling schemes. Here, the managing represents block recycling with respect to a data block, log block and the like using the selected scheme.

The memory controlling method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments and vice versa.

Figure 8:
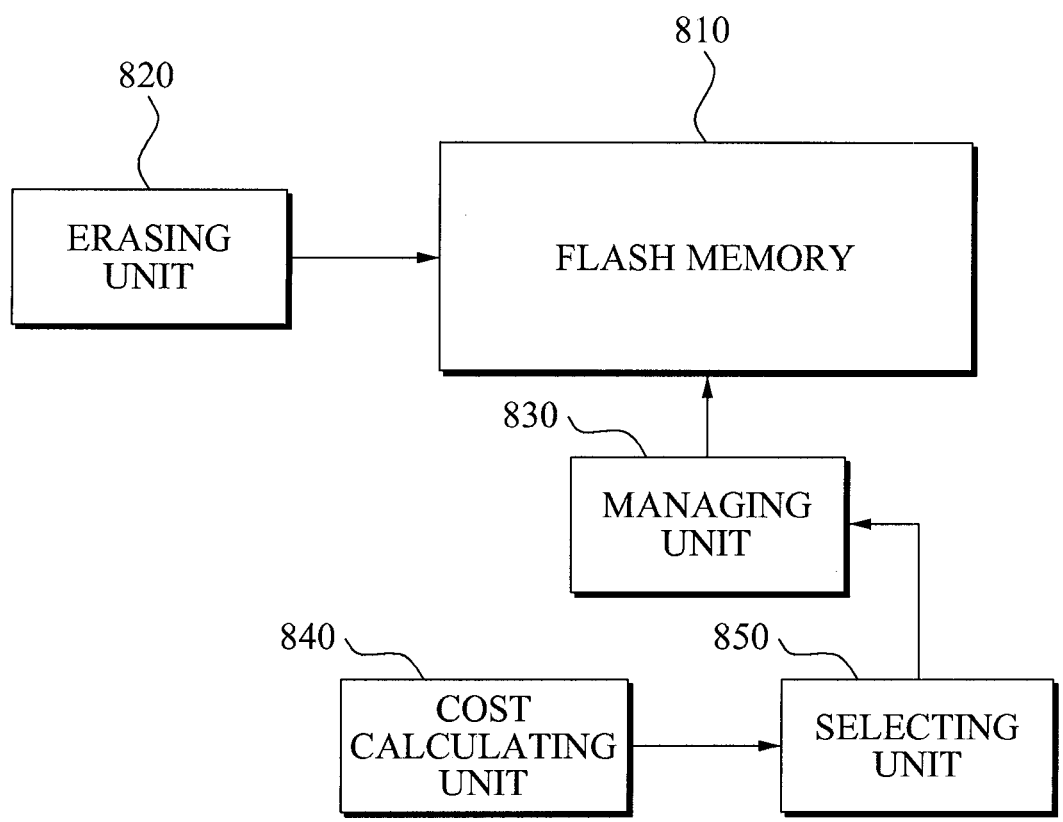
FIG. 8 is a block diagram illustrating a flash memory control device according to an example embodiment of the present invention.

FIG. 8 is a block diagram illustrating a flash memory control device according to an example embodiment.

Referring to FIG. 8, a flash memory device include a flash memory 810, erasing unit 820, managing unit 830, cost calculating unit 840, and selecting unit 850.

The flash memory 810 is composed of a plurality of blocks and the plurality of blocks may include data blocks and log blocks.

Also, the erasing unit 820 supports a multi-block erase function that simultaneously erase data stored in the plurality of blocks of the flash memory 810. That is, a plurality of blocks which are a target for erasing may be simultaneously erased. As described above, the present invention supports the multi-block erase function, thereby decreasing a cost expended for obtaining a single page.

Also, the managing unit 830 manages at least one block using at least one scheme from among available block recycling schemes when the multi-block erase function is supported.

That is, the managing unit 830 properly erases data of an invalid page and properly collects and arranges data of a valid page, thereby increasing efficiency of use of blocks composing the flash memory 810.

Also, the cost calculating unit 840 calculates a cost for each of the available block recycling schemes based on the multi-block erase function.

That is, as described above, according to a cost model disclosed in the present invention, the cost calculating unit 840 calculates the cost for each of the available block recycling schemes based on a number of the plurality of blocks where the multi-block erase function is applied.

Also, the selecting unit 840 may select at least one scheme from among the available block recycling schemes based on the calculated cost. In this instance, at least one scheme with a minimum cost may be selected from among the available block recycling schemes.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A device for controlling a flash memory, the device comprising:
   an erasing unit adapted to support a multi-block erase function that simultaneously erases data stored in a plurality of blocks of the flash memory; and
   a managing unit adapted to manage at least one block of the plurality of blocks using at least one block recycling scheme from a plurality of preselected block recycling schemes when the multi-block erase function is supported, wherein the at least one block recycling scheme is selected based on a calculated cost for using the block recycling schemes in conjunction with the multi-block erase function.

2. The device of claim 1, further comprising:
   a cost calculating unit adapted to calculate the calculated cost for each of the plurality of preselected block recycling schemes in conjunction with the multi-block erase function; and
   a selecting unit adapted to select the at least one block recycling scheme from the plurality of preselected block recycling schemes based on the calculated cost for using the plurality of preselected block recycling schemes in conjunction with the multi-block erase function.

3. The device of claim 2, wherein the cost calculating unit calculates the calculated cost for each of the plurality of preselected block recycling schemes based on a number of the plurality of blocks where the multi-block erase function is applied.

4. The device of claim 2, wherein the selecting unit selects the at least one block recycling scheme with a minimum cost from the plurality of preselected block recycling schemes.

5. The device of claim 1, wherein the managing unit processes data of at least one invalid page included in the at least one block through using the selected at least one block recycling scheme from the plurality of preselected block recycling schemes.

6. The device of claim 1, wherein the plurality of blocks include at least one data block or at least one log block.

7. The device of claim 1, wherein the plurality of preselected block recycling schemes include at least one of an merge operation scheme, a switch operation scheme, a copy and switch operation scheme, a migration operation scheme, and a page erase and copy operation scheme.

8. The device of claim 1, wherein the erasing unit supports a page unit erase function that selectively erases a plurality of pages included in each of the plurality of blocks of the flash memory.

9. A method for controlling a flash memory including a first block and a second block, the method comprising:

selectively erasing elimination target data recorded in at least one invalid page existing in the first block, wherein less than all pages in the first block are erased;

copying valid data recorded in at least one valid page existing in the second block to the at least one invalid page existing in the first block where the elimination target data is erased; and erasing data recorded in a plurality of pages existing in the second block.

10. The method of claim 9, wherein the selectively erasing of the elimination target data comprises:

copying data recorded in at least one valid page existing in the first block to at least one page existing in a third block when the data recorded in the at least one valid page existing in the first block has a possibility of being erased while performing the selectively erasing.

11. The method of claim 10, wherein the copying of the valid data recorded in the at least one page existing in the second block further comprises:

copying data copied to the at least one page existing in the third block to the plurality of pages existing in the first block.

12. A non-transitory computer readable media storing a program for implementing a method of claim 11.

13. A non-transitory computer readable media storing a program for implementing a method of claim 10.

14. The method of claim 9, wherein the erasing of the data simultaneously erases data recorded in the plurality of pages existing in the second block.

15. A non-transitory computer readable media storing a program for implementing a method of claim 12.

16. A non-transitory computer readable media storing a program for implementing a method of claim 9.

17. A method for controlling a flash memory device, the method comprising:

calculating a cost for each of a plurality of block recycling schemes based on a multi-block erase function when the multi-block erase function is supported, the multi-block erase function being a function that simultaneously erases data stored in a plurality of blocks of a flash memory;

selecting at least one block recycling scheme from among the plurality of block recycling schemes based on the calculated cost; and managing at least one block of the plurality of blocks of the flash memory using the at least one block recycling scheme selected from the plurality of block recycling schemes.

18. The method of claim 17, wherein the managing of the at least one block processes data of at least one invalid page included in the at least one block using the at least one block recycling scheme selected from the plurality of block recycling schemes.

19. A non-transitory computer readable media storing a program for implementing a method of claim 18.

20. The method of claim 17, wherein the calculating step calculates the calculated cost for each of the plurality of block recycling schemes based on a number of the plurality of blocks where the multi-block erase function is applied.

21. A non-transitory computer readable media storing a program for implementing a method of claim 20.

22. The method of claim 17, wherein the selecting of the at least one block recycling scheme selects the at least one block recycling scheme with a minimum cost from the plurality of block recycling schemes.

23. A non-transitory computer readable media storing a program for implementing a method of claim 22.

24. The method of claim 17, wherein the plurality of block recycling schemes include at least one of a merge operation scheme, a switch operation scheme, a copy and switch operation scheme, a migration operation scheme, and a page erase and copy operation scheme.

25. A non-transitory computer readable media storing a program for implementing a method of claim 24.

26. A non-transitory computer readable media storing a program for implementing a method of claim 17.

* * * * *